United States Patent
Ma et al.

[11] Patent Number: 5,939,753
[45] Date of Patent: Aug. 17, 1999

[54] MONOLITHIC RF MIXED SIGNAL IC WITH POWER AMPLIFICATION

[75] Inventors: Jun Ma, Phoenix; Han-Bin Kuo Liang, Mesa; David Quoc-Hung Ngo, Phoenix; Shih King Cheng, Scottsdale; Edward T. Spears; Bruce R. Yeung, both of Chandler, all of Ariz.

[73] Assignee: Motorola, Inc., Schaumburg, Ill.

[21] Appl. No.: 08/832,512

[22] Filed: Apr. 2, 1997

[51] Int. Cl.[6] .......................... H01L 29/76; H01L 23/62; H01L 29/00
[52] U.S. Cl. .......................... 257/339; 257/360; 257/404; 257/516; 257/531
[58] Field of Search ..................... 257/275, 409, 257/369, 373, 500, 516, 531, 532, 533, 535, 538, 343, 360, 339, 404

[56] References Cited

U.S. PATENT DOCUMENTS

| | | | |
|---|---|---|---|
| 5,153,466 | 10/1992 | Stein et al. | 307/475 |
| 5,386,136 | 1/1995 | Williams et al. | 257/339 |
| 5,446,311 | 8/1995 | Ewen et al. | 257/531 |
| 5,490,171 | 2/1996 | Epley et al. | 375/257 |
| 5,510,648 | 4/1996 | Davies et al. | 257/404 |
| 5,554,873 | 9/1996 | Erdeljac et al. | 257/516 |
| 5,574,848 | 11/1996 | Thomson | 395/181 |
| 5,581,118 | 12/1996 | Mays | 257/666 |
| 5,590,412 | 12/1996 | Sawal et al. | 455/82 |
| 5,597,768 | 1/1997 | Passlack et al. | 437/236 |
| 5,598,086 | 1/1997 | Somerville | 320/30 |
| 5,598,107 | 1/1997 | Cabuk | 326/27 |
| 5,598,118 | 1/1997 | Koifman et al. | 327/108 |
| 5,604,369 | 2/1997 | Duvvury et al. | 257/360 |

OTHER PUBLICATIONS

"Device Electronics for Intergrated Circuits" by Muller, p. 104, 1986.
"Low–Power Radio–Frequency IC's for Portable Communications" by Asad A. Abidi, *Proceedings of the IEEE*, vol. 83, No. 4, Apr. 1995, pp. 544–569.
"Silicon MOSFETs, the Microwave Device Technology for the 90s" by Natalino Camilleri, Julio Costa, David Lovelace, David Ngo, 1993 *IEE MTT–s Digest*, pp. 545–548.

*Primary Examiner*—Steven H. Loke
*Attorney, Agent, or Firm*—Rennie William Dover

[57] ABSTRACT

A monolithic integrated circuit die (10) is fabricated to include unilateral FETs (113, 114, 115), RF passive devices such as a double polysilicon capacitor (57), a polysilicon resistor (58), and an inductor (155), and an ESD protection device (160). A first P+ sinker (28) provides signal isolation between two FETs (113, 115) separated by the first sinker (28) and is coupled to a source region (86) of a power FET (115) via a self-aligned titanium silicide structure (96). A second P+ sinker (29) is coupled to a bottom plate (44) of the double polysilicon capacitor (57). A third P+ sinker (178) is coupled to a source region (168) of the ESD protection device (160) via another titanium silicide structure (174).

19 Claims, 5 Drawing Sheets

FIG. 10

MONOLITHIC RF MIXED SIGNAL IC WITH POWER AMPLIFICATION

BACKGROUND OF THE INVENTION

The present invention relates, in general, to integrated circuits and, more particularly, to monolithic radio frequency integrated circuits.

Radio frequency integrated circuits are widely used in communication applications. More particularly in portable wireless communication applications, the demand for small, reliable, power efficient, and cost efficient radio frequency integrated circuits is constantly increasing.

Bipolar complementary metal oxide semiconductor (BiCMOS) technology is conventionally used to fabricate the radio frequency (RF) integrated circuit dice that process small analog and mixed-mode signals. The BiCMOS technology includes the fabrication of both bipolar transistors and metal oxide semiconductor (MOS) field effect transistors. Therefore, the BiCMOS technology includes complicated manufacturing processes and is cost inefficient. Further, it is very difficult to include high efficiency integrated power amplifiers in a BiCMOS process. Thus, an off-chip power amplifier is used to process large signals.

The power amplifier can be fabricated using technologies such as an RF laterally diffused metal oxide semiconductor (LDMOS) technology. However, the RF LDMOS technology does not provide a level of integration that is sufficiently high for integrating RF analog and digital functions on a single die, and its applications are primarily limited to power amplification.

In addition, the circuits fabricated using BiCMOS and/or LDMOS technologies are generally high power circuits that are not suitable for applications where low power consumption is considered to be an advantageous feature. Such applications include battery powered portable wireless communication applications, e.g., pagers, cellular phones, modems in portable computers, etc.

Accordingly, it would be advantageous to have a semiconductor integrated circuit die and a process for fabricating the die. It is desirable for the die and the process to provide a high level of integration and a power efficient circuit. It is also desirable for the die to be able to perform both radio frequency analog circuit and digital circuit functions. It would be of further advantage for the process to be simple and cost efficient.

BRIEF DESCRIPTION OF THE DRAWINGS

It should be noted that the figures are highly enlarged cross-sectional views and are not drawn to scale. It should also be noted that same reference numerals are used in the figures to represent the same elements.

DETAILED DESCRIPTION OF THE DRAWINGS

Generally, the present invention provides a monolithic integrated circuit (IC) and a process for fabricating the monolithic IC. The monolithic IC includes unilateral insulated gate field effect transistors (IGFETs) and radio frequency (RF) passive devices such as, for example, capacitors, inductors, and resistors. A unilateral IGFET has an asymmetric doping profile in the channel region. Compared with a conventional field effect transistor (FET), a unilateral FET provides higher transconductance and current carrying capability. By properly orienting the unilateral FETs, the performance of circuits such as RF low noise amplifiers, voltage controlled oscillators, integrated power amplifiers, mixers, etc. in an RF integrated circuit fabricated on the die is significantly improved. In accordance with the present invention, the RF passive devices and the unilateral FETs are fabricated on the same die in a fabrication process that is simpler and more cost efficient than the BiCMOS fabrication process. Therefore, the fabrication process can be used to integrate analog, digital, and mixed mode circuits on a single chip, thereby forming a system-on-a-chip. The digital circuits that can be integrated with the RF analog circuits on the same chip include digital signal processors, microcontrollers, etc. The fabrication process further includes forming signal isolation structures on the IC die. In accordance with the present invention, a signal isolation structure includes a sinker stacked with metallization structures, which provides good signal isolation between different circuit elements. In a single-chip system, good signal isolation between circuit elements, e.g., between a transmitter and a receiver in a single-chip or monolithic transceiver system, is advantageous.

Figure 1:
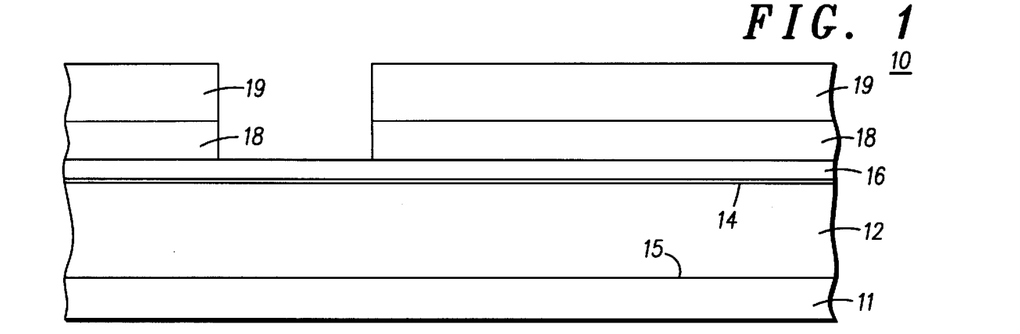
FIGS. 1–8 illustrate a process for fabricating a monolithic integrated circuit (IC) in accordance with the present invention.

FIG. 1 is a cross-sectional view of a portion of a semiconductor die 10 at an early stage of a fabrication process in accordance with the present invention. What is shown in FIG. 1 is a semiconductor substrate 11 having an epitaxial layer 12 grown thereon. By way of example, substrate 11 and epitaxial layer 12 are of P conductivity type, and the thickness of epitaxial layer 12 ranges between approximately 5 micrometers ($\mu$m) and approximately 10 $\mu$m. Substrate 11 has a high dopant concentration and a low resistivity ranging, for example, from approximately 0.01 ohm-centimeter ($\Omega$-cm) to approximately 0.1 $\Omega$-cm. Epitaxial layer 12 has a low dopant concentration ranging, for example, from approximately $1 \times 10^{15}$ atoms per cubic centimeter (atoms/cm$^3$) to approximately $5 \times 10^{15}$ atoms/cm$^3$ and a resistivity ranging, for example, from approximately 5 $\Omega$-cm to approximately 15 $\Omega$-cm. Epitaxial layer 12 has a major surface 14 opposite to an interface 15 between epitaxial layer 12 and substrate 11.

It should be understood that substrate 11 and epitaxial layer 12 are not limited to being of P conductivity type as described hereinbefore. The present invention is also applicable in the fabrication of a semiconductor IC using substrates and epitaxial layers of N conductivity type.

A dielectric layer such as, for example, an oxide layer 16 having a thickness ranging from approximately 40 nanometers (nm) to approximately 60 nm, is formed on major surface 14 of epitaxial layer 12. Oxide layer 16 serves to relieve the stress in epitaxial layer 12 near major surface 14 and protect major surface 14 during subsequent ion implantation processes. Thus, it is also referred to as a pad or screen oxide layer. Another dielectric layer such as, for example, a silicon nitride layer 18 having a thickness ranging from approximately 100 nm to approximately 200 nm is deposited on oxide layer 16. A masking layer 19 is deposited on nitride layer 18 and patterned to expose a portion of nitride layer 18. The portion of nitride layer 18 that is unprotected by masking layer 19 is removed in an etching process such as, for example, a reactive ion etching process. The etching process creates an opening in nitride layer 18 and exposes a portion of oxide layer 16.

Ions of N conductivity type such as, for example, phosphorus ions are implanted into epitaxial layer 12 through the opening in nitride layer 18. By way of example, the dose of the ion implantation is between approximately $2\times10^{12}$ ions per square centimeter (ions/cm$^2$) and approximately $8\times10^{12}$ ions/cm$^2$, and the energy of the ion implantation is between approximately 80 kilo-electron-volts (keV) and approximately 120 keV.

Figure 2:
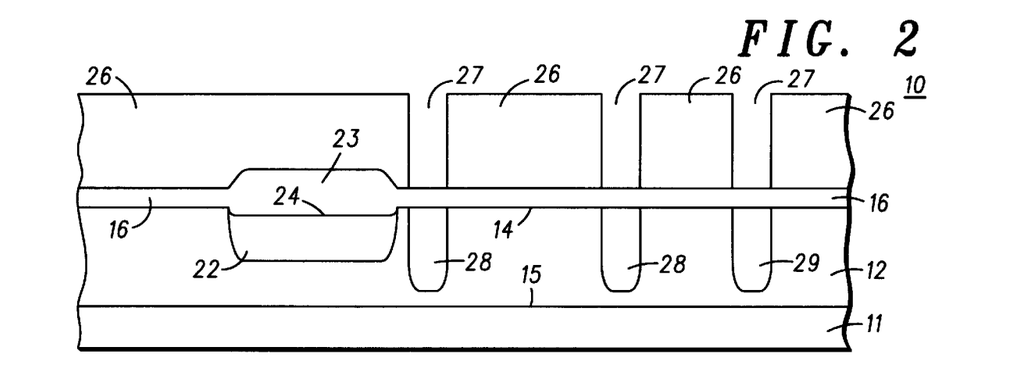

Referring now to FIG. 2, masking layer 19 (shown in FIG. 1) is removed, and substrate 11 is placed in an elevated temperature environment for an annealing process, thereby forming a well 22 of N conductivity type in epitaxial layer 12. Preferably, the annealing process is performed in an environment filled with oxygen. Thus, an oxide layer 23 is formed overlying N-well 22. As those skilled in the art are aware, oxide layer 23 consumes the portion of oxide layer 16 overlying N-well 22 and extends from major surface 14 partially into epitaxial layer 12. The portion of major surface 14 of epitaxial layer 12 overlying N-well 22 is identified by reference numeral 24. The thickness of epitaxial layer 12 between portion 24 of major surface 14 and interface 15 is less than the thickness of epitaxial layer 12 between the portion of major surface 14 outside portion 24 and interface 15.

Nitride layer 18 (shown in FIG. 1) is etched away. A masking layer 26 is formed over oxide layers 16 and 23. Masking layer 26 is patterned to have openings 27. Ions of P conductivity type such as, for example, boron ions are implanted into epitaxial layer 12 through openings 27 in masking layer 26. By way of example, the dose of the ion implantation ranges from approximately $1\times10^{15}$ ions/cm$^2$ to $6\times10^{15}$ ions/cm$^2$ and the energy of the ion implantation ranges from approximately 50 keV to approximately 80 keV. The implanted ions form P$^+$ sinkers 28 and 29 in epitaxial layer 12. Sinker 28 is preferably configured to enclose a region in epitaxial layer 12. A sinker is sometimes also referred to as a plug.

Figure 3:
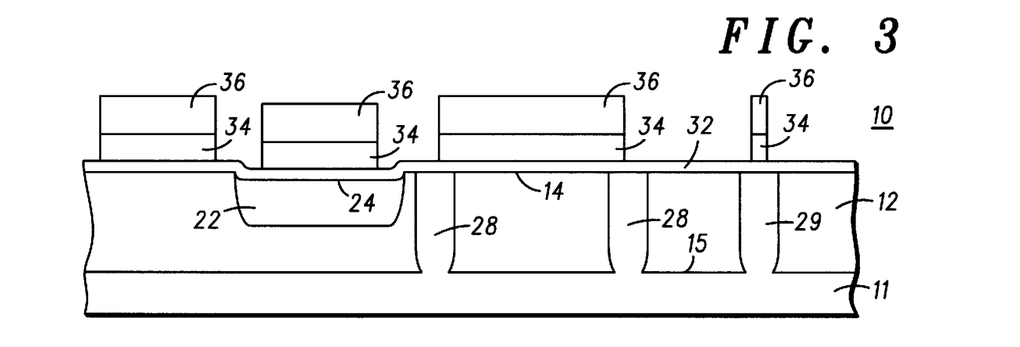

FIG. 3 illustrates die 10 at a later stage of the fabrication process. Masking layer 26 (shown in FIG. 2) is removed. Substrate 11 goes through an annealing process, and P$^+$ sinkers 28 and 29 extend from major surface 14 of epitaxial layer 12 to interface 15. A sinker extending from major surface 14 of epitaxial layer 12 to substrate 11, such as sinker 28, provides good signal isolation between devices formed in epitaxial layer 12 and separated from each other by the sinker. In subsequent steps of the fabrications process, metallization structures are formed in the interlayer dielectric layers over epitaxial layer 12 and on top of the sinker. The metallization structures and the sinker form a conductive stack, which provides signal isolation between different circuit elements fabricated on die 10. In addition, a sinker formed adjacent a power device provides a good heat sink for the power device.

Oxide layers 16 and 23 (shown in FIG. 2) are etched away. A second pad oxide layer 32 having a thickness between, for example, approximately 40 nm and approximately 60 nm is formed over epitaxial layer 12. A nitride layer 34 is deposited on pad oxide layer 32, and a masking layer 36 is formed on nitride layer 34. Masking layer 36 is patterned to cover active regions of epitaxial layer 12, where FETs will be formed in subsequent process steps. Nitride layer 34 is etched through masking layer 36 using a reactive ion etching process. Masking layer 36 is then removed.

Figure 4:
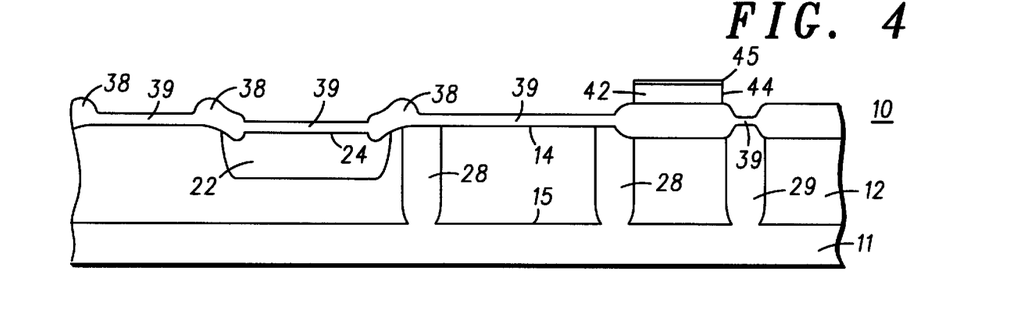

Referring now to FIG. 4, a field oxide layer 38 is formed over the portions of epitaxial layer 12 exposed by the openings in nitride layer 34 (shown in FIG. 3) in a local oxidation of silicon (LOCOS) process. Field oxide layer 38 provides an isolation structure between devices formed in the active regions of epitaxial layer 12. Preferably, an ion implantation is performed before forming field oxide layer 38 to form heavily doped regions (not shown) under field oxide layer 38. The heavily doped regions (not shown) prevent inadvertent turning on of parasitic FETs formed under field oxide layer 38. It should be understood that the isolation structures on die 10 can be formed using other processes such as, for example, poly-buffered LOCOS, poly-encapsulated LOCOS, trenching, etc.

Nitride layer 34 and pad oxide layer 32 (shown in FIG. 3) are etched away. A sacrificial oxide layer 39 is formed over epitaxial layer 12. A polysilicon layer 42 is deposited on field oxide layer 38 and sacrificial oxide layer 39. By way of example, polysilicon layer 42 has a thickness ranging between approximately 200 nm and approximately 400 nm. Polysilicon layer 42 is doped to increase its conductivity. Preferably, polysilicon layer 42 is doped so that its sheet resistance is less than approximately 20 ohms per square ($\Omega$/square). A plurality of dielectric layers such as, for example, a bottom oxide layer having a thickness of approximately 10 nm, a nitride layer having a thickness of approximately 15 nm, and a top oxide layer having a thickness of approximately 25 nm are formed on polysilicon layer 42. The top oxide layer, the nitride layer, the bottom oxide layer, and polysilicon layer 42 are patterned and etched to produce a bottom polysilicon plate 44 and an oxide-nitride-oxide (ONO) dielectric stack 45 over field oxide layer 38. It should be understood that dielectric stack 45 is not limited to including two oxide layers and a nitride layer therebetween as described hereinbefore. Dielectric stack 45 may include any number of dielectric layers, e.g., one, two, four, five, etc.

Figure 5:
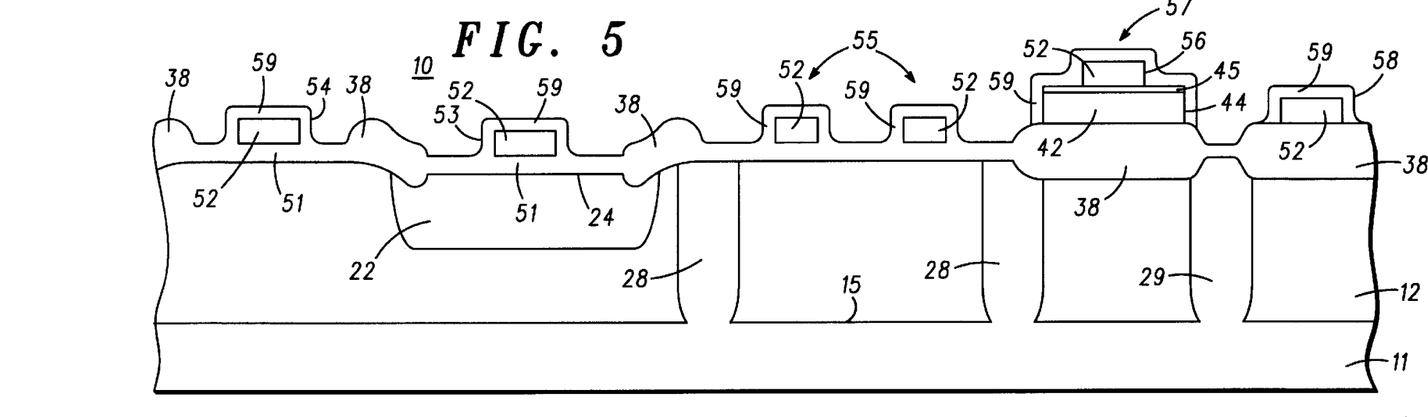

Referring now to FIG. 5, sacrificial oxide layer 39 (shown in FIG. 4) is etched away. A gate dielectric layer such as, for example, a silicon dioxide layer 51 having a thickness between approximately 6 nm and approximately 12 nm is formed over epitaxial layer 12. A polysilicon layer 52 is deposited on oxide layer 51, ONO dielectric stack 45, and field oxide layer 38. Polysilicon layer 52 is patterned to form a single-finger polysilicon gate 53, a single-finger polysilicon gate 54, and a double-finger polysilicon gate 55 on oxide layer 51, a top polysilicon plate 56 on ONO dielectric stack 45, and a polysilicon resistor 58 on field oxide layer 38. Top polysilicon plate 56, ONO dielectric stack 45, and bottom polysilicon plate 44 form a double polysilicon capacitor (DPC) 57. An oxide layer 59 having a thickness between, for example, approximately 5 nm and approximately 15 nm is formed on polysilicon gates 53, 54, and 55, DPC 57, and polysilicon resistor 58.

In subsequent steps of the fabrication process, a P-channel unilateral IGFET is formed under a gate structure formed by polysilicon gate 53 and dielectric layer 51, an N-channel unilateral IGFET is formed under a gate structure formed by polysilicon gate 54 and dielectric layer 51, and an N-channel unilateral power IGFET is formed under a gate structure formed by polysilicon gate 55 and dielectric layer 51. Although FIG. 5 shows polysilicon gates 53 and 54 as single finger gates, and polysilicon gate 55 as a double finger gate, this is not intended as a limitation of the present invention. The gate of an IGFET fabricated on die 10 can have any number of fingers, e.g., one, two, three, four, and so on. In order to have a large current carrying capability, a power IGFET preferably has a multi-finger gate.

Figure 6:
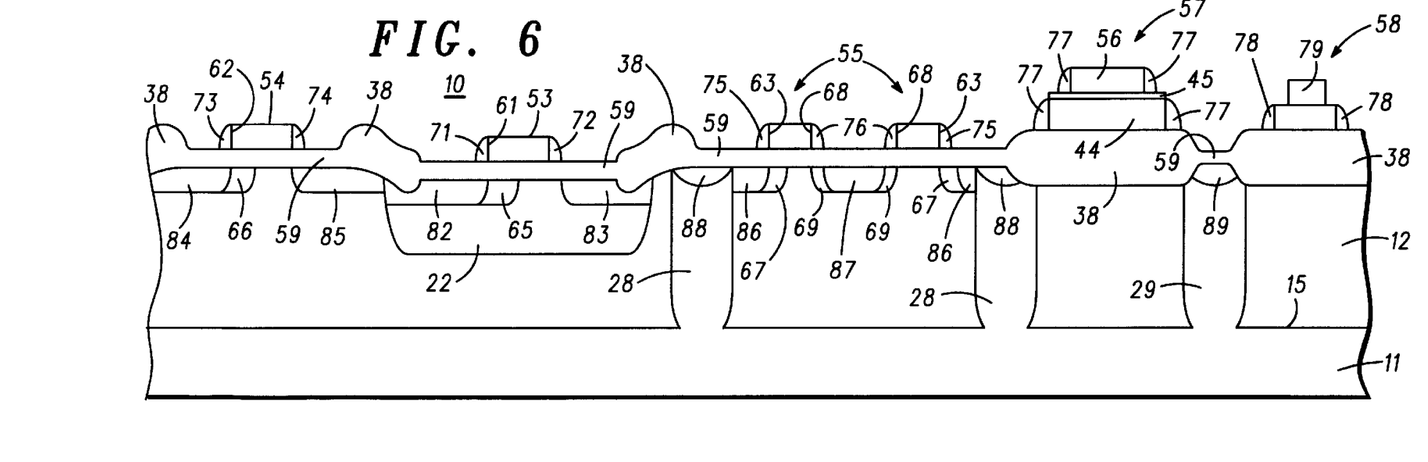

FIG. 6 shows die 10 at a subsequent stage of the fabrication process. Ions of N conductivity type, e.g., phosphorus ions, are implanted into N-well 22 near an edge 61 of gate 53. By way of example, phosphorus ions are implanted in an ion implantation process having a dose ranging from approximately $1 \times 10^3$ ions/cm$^2$ to approximately $6 \times 10^{13}$ ions/cm$^2$ and an energy ranging from approximately 30 keV to approximately 50 keV. An annealing process is performed at a temperature between, for example, approximately 800 degrees Celsius (° C.) and approximately 1200° C. for a time duration between, for example, approximately 40 minutes and approximately 80 minutes. During the annealing process, the implanted phosphorus ions diffuse to regions under gate 53, thereby forming a source side channel region 65.

Ions of P conductivity type, e.g., boron ions, are implanted into epitaxial layer 12 near an edge 62 of gate 54 and near an edge 63 of gate 55. By way of example, boron ions are implanted in an ion implantation process having a dose ranging from approximately $1 \times 10^{13}$ ions/cm$^2$ to approximately $6 \times 10^{13}$ ions/cm$^2$ and an energy ranging from approximately 20 keV to approximately 30 keV. A second annealing process is performed at a temperature ranging, for example, from approximately 800° C. to approximately 1200° C. for a time duration ranging, for example, from approximately 20 minutes to approximately 40 minutes. During the second annealing process, the implanted boron ions diffuse to regions under gates 54 and 55, thereby forming source side channel regions 66 and 67, respectively.

The ions forming source side channel regions 65, 66, and 67 described hereinbefore are preferably implanted into epitaxial layer 12 in a direction substantially perpendicular to major surface 14. Thus, the ion implantation processes are also referred to as zero-degree unilateral ion implantation. It should be understood that source side channel regions 65, 66, and 67 under polysilicon gates 53, 54, and 55 are not limited to being formed via the zero-degree unilateral ion implantation and diffusion processes. In an alternative embodiment of the present invention, source side channel regions 65, 66, and 67 are formed through angled ion implantation processes.

In an ion implantation process having a dose ranging, for example, from approximately $1 \times 10^{12}$ ions/cm$^2$ to approximately $8 \times 10^{12}$ ions/cm$^2$ and an energy ranging, for example, from approximately 100 keV to approximately 140 keV, ions of N conductivity type, e.g., phosphorus ions, are implanted into epitaxial layer 12 adjacent an edge 68 of gate 55. The implanted phosphorus ions form a drain extension region 69 of a power IGFET formed in epitaxial layer 12. It should be understood that drain extension region 69 is an optional feature in a power FET, which provides the power FET with a higher break down voltage. However, a power FET without a drain extension region usually has improved performance in high frequency applications compared with a power FET with the drain extension region.

A masking layer (not shown) is formed over epitaxial layer 12 and overlying N-well 22 and polysilicon resistor 58. The masking layer (not shown) also overlies a portion of drain extension region 69 adjacent polysilicon gate 55. A high dose of ions of N conductivity type, e.g., arsenic ions at a dose ranging from approximately $1 \times 10^{15}$ ions/cm$^2$ to approximately $5 \times 10^{15}$ ions/cm$^2$ and an energy ranging from approximately 80 keV to approximately 100 keV, is implanted into epitaxial layer 12 to form N conductivity type source and drain regions 84 and 85 adjacent polysilicon gate 54 and N conductivity type source and drain regions 86 and 87 adjacent polysilicon gate 55. Source and drain regions 84 and 85 define a channel region therebetween under polysilicon gate 54. The channel region under polysilicon gate 54 has a source side dopant concentration adjacent source region 84 that is higher than a drain side dopant concentration adjacent drain region 85. Likewise, source region 86 and drain extension region 69 define a channel region therebetween under polysilicon gate 55. The channel region under polysilicon gate 55 has a source side dopant concentration adjacent source region 86 that is higher than a drain side dopant concentration adjacent drain extension region 69. The high dose arsenic ion implantation also dopes polysilicon gates 54 and 55, and top polysilicon plate 56 of DPC 57.

In order to minimize an undesirable phenomenon referred to as boron penetration and characterized by the diffusion of boron ions from polysilicon gate 53 into epitaxial layer 12 via oxide layer 51, a low dose of boron fluoride (BF$_2$) ions is implanted into polysilicon gate 53 and into N-well 22 aligned with the two edges of gate 53. By way of example, the dose and energy of the low dose boron fluoride ion implantation range from approximately $2 \times 10^{14}$ ions/cm$^2$ to approximately $6 \times 10^{14}$ ions/cm$^2$ and from approximately 35 keV to approximately 45 keV, respectively. Polysilicon resistor 58 is also doped in the low dose boron fluoride ion implantation process to adjust its sheet resistance. Preferably, the sheet resistance of polysilicon resistor 58 is between approximately 800 $\Omega$/square and approximately 2000 $\Omega$/square. A high sheet resistance for polysilicon resistor 58 provides the circuit designer with the capability of designing a compact resistor and is therefore desirable. Accordingly, polysilicon resistor 58 is preferably forming using the low dose ion implantation.

Dielectric spacers such as, for example, nitride spacers 71 and 72 are formed along the two edges of gate 53. The process of forming nitride spacers 71 and 72 also forms nitride spacers 73 and 74 along the two edges of gate 54, nitride spacers 75 and 76 adjacent gate 55, nitride spacers 77 for DPC 57, nitride spacers 78 adjacent polysilicon resistor 58, and a nitride block 79 covering a portion of polysilicon resistor 58. The process of forming nitride spacers/blocks is well known in the art. Preferably, the process includes the deposition and densification of a tetra-ethyl-orthosilicate (TEOS) layer (not shown) before depositing and patterning the nitride spacers/blocks. FIG. 6 shows that nitride spacer 76 is aligned with gate 55 and overlies drain extension region 69. It should be noted that this is not a limitation of the present invention. In an alternative embodiment, nitride spacer 76 is replaced by a nitride block (not shown) that partially overlies gate 55 and overlies drain extension region 69. It should also be noted that nitride spacers 71, 72, 73, 74, 75, 76, 77, 78, and nitride block 79 can be replaced by spacers/blocks made of other types of dielectric materials, e.g., TEOS, undoped polysilicon, or the like.

A high dose of ions of P conductivity type, e.g., boron ions, at a dose ranging from approximately $1 \times 10^{15}$ ions/cm$^2$ to approximately $4 \times 10^{15}$ ions/cm$^2$ and an energy ranging from approximately 15 keV to approximately 30 keV, is implanted into N-well 22 and aligned with nitride spacers 71 and 72, thereby forming P conductivity type source and drain regions 82 and 83, respectively. Source and drain regions 82 and 83 define a channel region therebetween under polysilicon gate 53. The channel region under polysilicon gate 53 has a source side dopant concentration adjacent source region 82 that is higher than a drain side dopant concentration adjacent drain region 83. Nitride block 79 prevents polysilicon resistor 58 from being doped in the high dose boron ion implantation. The high dose boron ion implantation also dopes polysilicon gate 53 and sinkers 28 and 29. The implanted boron ions in sinkers 28 and 29 form heavily doped regions 88 and 89, respectively, which further increase the conductivity of respective sinkers 28 and 29. The high dose boron ion implantation is followed by a rapid thermal annealing (RTA) process at a temperature of between, for example, approximately 800° C. and approximately 1200° C. for a time duration between, for example, approximately 20 seconds and approximately 60 seconds.

Figure 7:
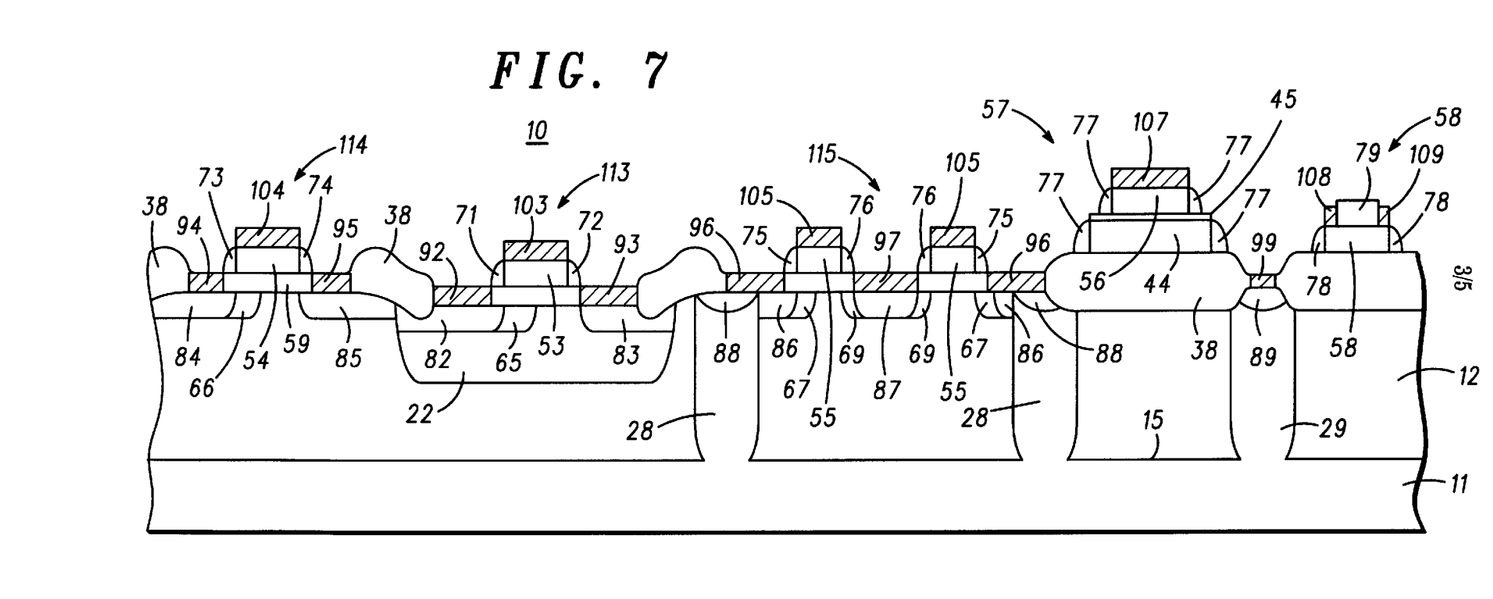

Referring now to FIG. 7, a wet etching process etches away oxide layer 59 (shown in FIG. 5) that is unprotected by nitride spacers 71, 72, 73, 74, 75, 76, 77, 78, and nitride block 79. A titanium layer having a thickness between, for example, approximately 30 nm and approximately 60 nm is deposited over epitaxial layer 12. A silicon implant having a dose ranging, for example, from approximately $1\times10^{14}$ ions/cm$^2$ to approximately $4\times10^{15}$ ions/cm$^2$ and an energy ranging, for example, from approximately 50 keV to approximately 70 keV is performed. An RTA process at a temperature between, for example, approximately 600° C. and approximately 700° C. for a time duration between, for example, approximately 40 seconds and approximately 80 seconds is performed on die 10 in an environment of an inert gas such as, for example, nitrogen gas. The RTA process assists the reaction between titanium and silicon to form a titanium silicide (TiSi$_2$) layer. The implanted silicon prevents defects from forming in epitaxial layer 12 during the process of forming the TiSi$_2$ layer. The titanium deposited on field oxide layer 38 and nitride spacers 71, 72, 73, 74, 75, 76, 77, and 78, and nitride block 79 remains as metallic titanium after the RTA and is removed in a wet etching process. A second RTA process at a temperature between, for example, approximately 800° C. and approximately 900° C. for a time duration between, for example, approximately 20 seconds and approximately 40 seconds in an environment of an inert gas such as, for example, nitrogen gas is performed after the metallic titanium is etched away.

Through the titanium deposition, silicon implantation, RTA, and wet etching processes as described hereinbefore, a titanium silicide structure is formed over epitaxial layer 12. As shown in FIG. 7, the titanium silicide structure includes titanium silicide regions 92 and 93 overlying source and drain regions 82 and 83, respectively, and titanium silicide regions 94 and 95 overlying source and drain regions 84 and 85, respectively. The titanium silicide structure also includes a titanium silicide region 96 overlying source region 86 and heavily doped region 88 in sinker 28, a titanium silicide region 97 overlying drain region 87, and a titanium silicide region 99 overlying heavily doped region 89 in sinker 29. Further, the titanium silicide structure includes titanium silicide regions 103, 104, 105, 107, 108, and 109 on polysilicon gates 53, 54, 55, top polysilicon plate 56 of DPC 57, and polysilicon resistor 58. Titanium silicide regions 92, 93, 94, 95, 96, 97, 99, 103, 104, 105, 107, 108, and 109 are formed in the same process steps and are aligned with nitride spacers 71, 72, 73, 74, 75, 76, 77, 78, and nitride block 79. Thus, they are also referred to as self aligned silicide (salicide) regions.

Titanium silicide regions 92, 93 and 103 serve as the source, drain, and gate electrodes, respectively, of a P-channel unilateral IGFET 113. Titanium silicide regions 94, 95 and 104 serve as the source, drain, and gate electrodes, respectively, of an N-channel unilateral IGFET 114. Titanium silicide regions 96, 97 and 105 serve as the source, drain, and gate electrodes, respectively, of an N-channel unilateral power IGFET 115. Titanium silicide region 96 also electrically couples source region 86 of power FET 115 to substrate 11 via sinker 28. Titanium silicide region 107 serves as an electrode of DPC 57. Titanium silicide regions 108 and 109 serve as the two electrodes of polysilicon resistor 58. It should be understood that the electrodes of the devices fabricated on die 10 are not limited to be formed from titanium silicide structures. They can be formed from other types of conductive structures such as, for example, tungsten silicide, molybdenum silicide, cobalt silicide structures, or the like.

Figure 8:
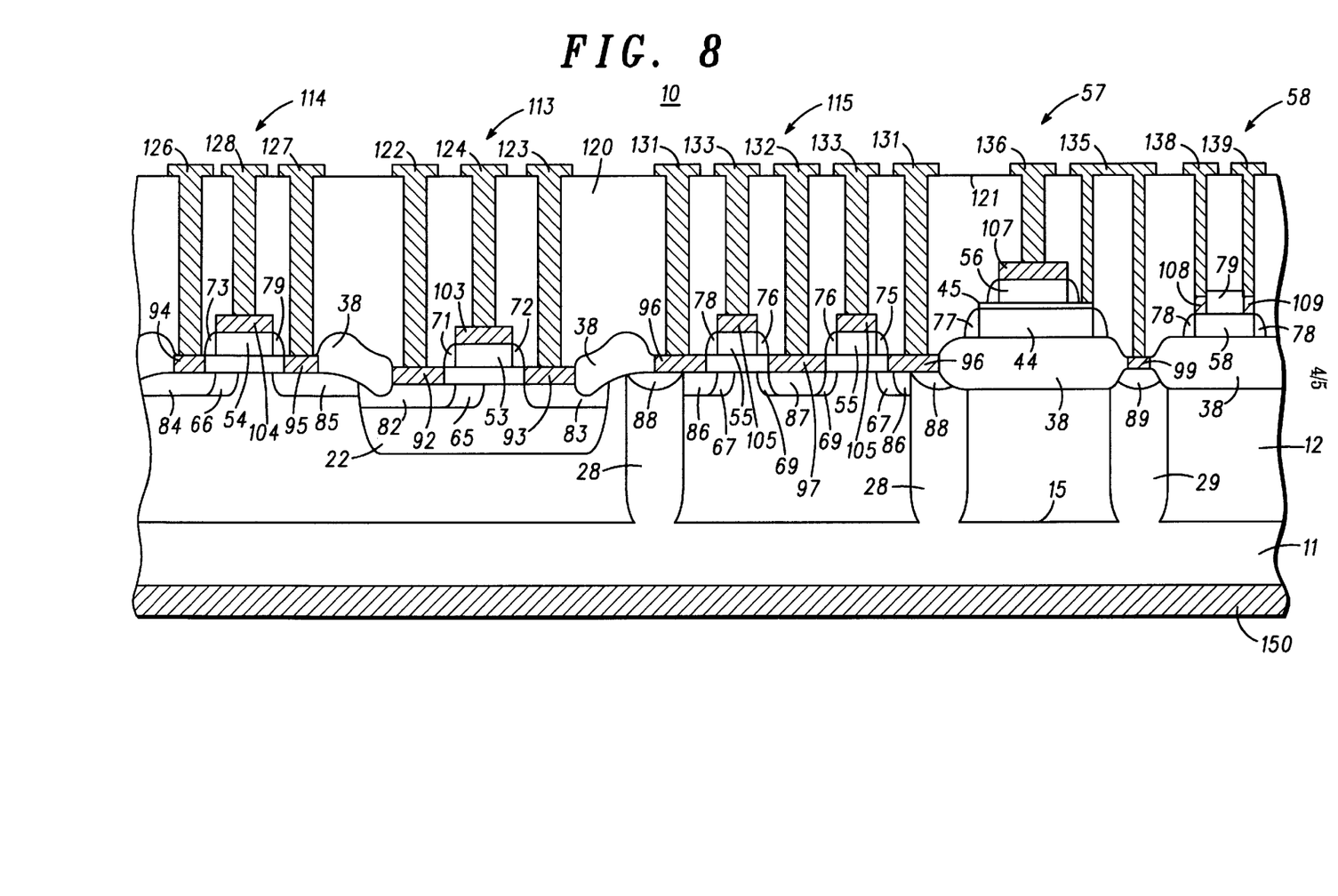

FIG. 8 shows die 10 at a subsequent stage of the fabrication process. An insulating layer such as, for example, an oxide layer 120, is formed over epitaxial layer 12 and planarized. Oxide layer 120 is also referred to as an interlayer dielectric (ILD). Metallization regions are formed in oxide layer 120 to lead the electrodes of the devices formed on epitaxial layer 12 to a front surface 121 of oxide layer 120. As shown in FIG. 8, metallization regions 122, 123, and 124 are electrically coupled to source electrode 92, drain electrode 93, and gate electrode 103, respectively, of FET 113, metallization regions 126, 127, and 128 are electrically coupled to source electrode 94, drain electrode 95, and gate electrode 104, respectively, of FET 114, and metallization regions 131, 132, and 133 are electrically coupled to source electrode 96, drain electrode 97, and gate electrode 105, respectively, of power FET 115. Further, metallization regions 135 and 136 are electrically coupled to bottom polysilicon plate 44 and top polysilicon plate 56, respectively, of DPC 57, and metallization regions 138 and 139 are electrically coupled to electrodes 108 and 109, respectively, of polysilicon resistor 58. In addition, metallization region 135 electrically couples bottom polysilicon plate 44 of DPC 57 to substrate 11 via sinker 29.

Subsequently, a second interlayer dielectric (not shown) is formed on front surface 121 of oxide layer 120. Metallization regions (not shown) are formed in the second interlayer dielectric and electrically coupled to the electrodes of the devices formed on die 10.

A metal layer 150 is formed on the back surface of substrate 11. When using die 10 to perform a circuit function, metal layer 150 is usually coupled to a reference voltage level such as, for example, ground voltage level. Therefore, source region 86 of power FET 115 is grounded through sinker 28. Likewise, bottom polysilicon plate 44 of DPC 57 is grounded through sinker 29. In addition, the sinkers, e.g., sinkers 28 and 29, and the metallization regions formed thereon form grounded conductive stacks, which provide good signal isolation between different devices and/or circuit elements on die 10.

It should be understood that FIGS. 1–8 only show a portion of die 10. Die 10 usually includes more devices fabricated thereon than those shown in FIG. 8. For example, die 10 may include additional FETs, additional double polysilicon capacitors, and additional polysilicon resistors. Additional FETs (not shown) fabricated on die 10 can have asymmetrically doped channel regions, symmetrically doped channel regions, or uniformly doped channel regions. Die 10 may also include diffusion resistors and/or monosilicon capacitors. A monosilicon capacitor is formed by growing a gate oxide layer on epitaxial layer 12 and depositing a polysilicon gate layer on the gate oxide layer. When the monosilicon capacitor is formed on top of a sinker in epitaxial layer 12, the capacitor becomes a shunt capacitor.

Although FIG. 8 shows that source region 86 of power FET 115 and bottom polysilicon plate 44 of DPC 57 are grounded via sinkers 28 and 29, respectively, these are not intended as limitations of the present invention. Depending on the circuit function it is designed to perform, die 10 may include a power FET with grounded source, a power FET with floating source, a capacitor with a plate grounded, or a capacitor with both of its two plates connected to other devices (not shown) fabricated on die 10. Further, the source region of a power FET is not limited to being coupled to ground voltage level via a titanium silicide structure and a sinker as described hereinbefore. For example, the source region of a power FET can be coupled to ground voltage level via metallization lines (not shown).

Figure 9:
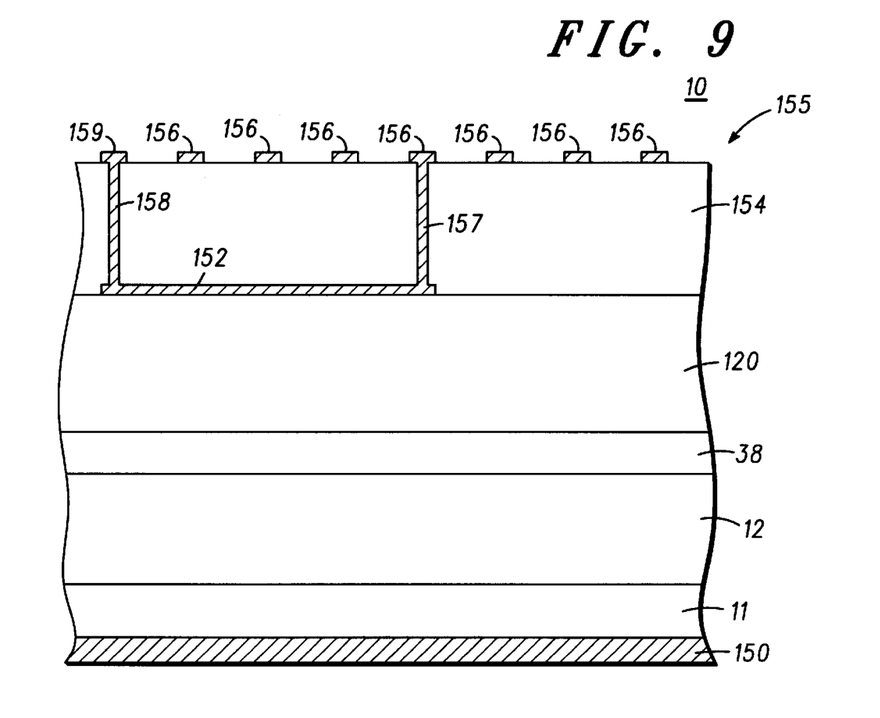
FIG. 9 illustrates an inductor fabricated in a monolithic IC in accordance with the present invention.

FIG. 9 illustrates, in a cross-sectional view, an inductor 155 fabricated on semiconductor IC die 10 in accordance with the present invention. FIG. 9 shows a portion of die 10 that is outside the portion of die 10 shown in FIGS. 1–8. As described hereinbefore, die 10 includes substrate 11, epitaxial layer 12 disposed on substrate 11, field oxide layer 38 grown on epitaxial layer 12, and insulating layer 120 deposited over epitaxial layer 12.

The process of forming inductor 155 starts with forming a metallization line 152 on insulating layer 120 and overlying a portion of field oxide layer 38. Preferably, metallization line 152 is formed in the same step as metallization regions 122, 123, 124, 126, 127, 128, 131, 132, 133, 135, 136, 138, and 139 (shown in FIG. 8) are formed. Another insulating layer, such as a silicon dioxide layer 154, is formed over oxide layer 120 and covers metallization line 152. Oxide layer 154 is also referred to as the second interlayer dielectric.

A metallization line 156 is formed on oxide layer 154. Metallization line 156 is configured to have a spiral shape and functions as inductor 155. A conductive via 157 in oxide layer 154 electrically couples an end of metallization line 156 at the center of the spiral to metallization line 152. Another conductive via 158 electrically couples metallization line 152 to a metallization pad 159 formed on oxide layer 154. Metallization pad 159 serves as one electrode of inductor 155, and an end of metallization line 156 at the periphery of the spiral serves as another electrode of inductor 155. The electrodes of inductor 155 are coupled to other devices (not shown) fabricated on die 10 in accordance with the designed circuit function of die 10.

In order to increase its quality factor (Q), inductor 155 is preferably well isolated from substrate 11 and has a small resistance. A thick oxide layer 120 or 154 will improve the isolation of inductor 155 from substrate 11. By way of example, oxide layer 120 ranges from approximately 700 nm to approximately 900 nm in thickness and oxide layer 154 ranges from approximately 800 nm to approximately 1000 nm in thickness. Other approaches for improving the isolation of inductor 155 include forming additional dielectric layers (not shown) between epitaxial layer 12 and inductor 155, forming an N-well (not shown) in epitaxial layer 12 below inductor 155, etc. An approach for reducing the resistance and thereby increasing the Q of inductor 155 is to form multiple layers, e.g., two, three, four, five, six, etc., of spirally shaped metallization lines. For example, in an embodiment of the present invention, inductor 155 includes two layers of metallization lines. The first layer of metallization line (not shown) is formed on oxide layer 120 and configured in a spiral shape. The second layer of metallization line, e.g., metallization line 156, is formed on oxide layer 154, configured in a spiral shape, and preferably directly above the first layer of metallization line. In other words, the two layers of metallization lines preferably form a stack. The two layers of metallization lines are coupled to each other via a plurality of conductive vias in oxide layer 154.

Figure 10:
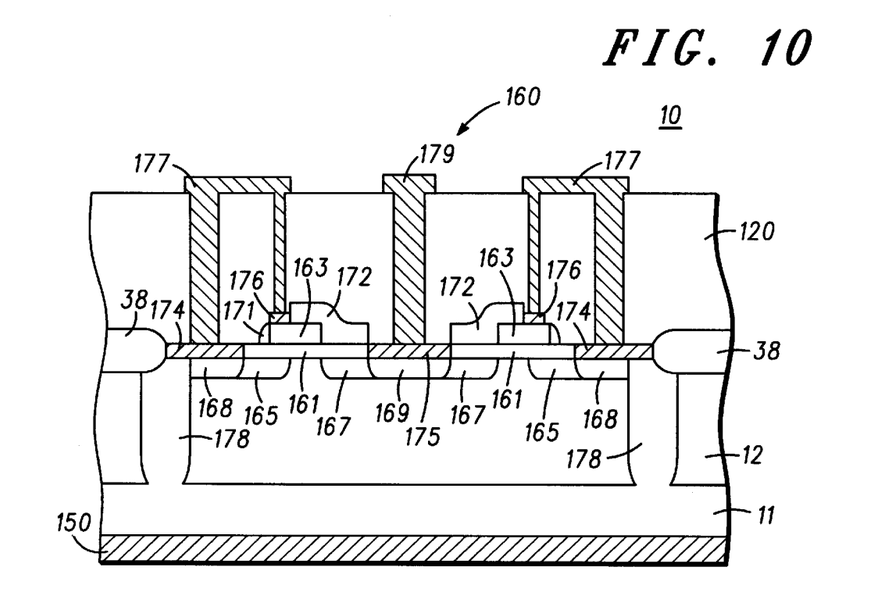
FIG. 10 illustrates an electrostatic discharge protection device fabricated in a monolithic IC in accordance with the present invention.

FIG. 10 illustrates, in a cross-sectional view, an electrostatic discharge (ESD) protection device 160 fabricated on semiconductor IC die 10 in accordance with the present invention. FIG. 10 shows a portion of die 10 that is outside the portions of die 10 shown in FIGS. 1–9. Preferably, ESD protection device 160 has a ring structure, and FIG. 10 shows a cross section of the ring structure.

ESD protection device 160 includes a ring shaped gate structure that is comprised of a gate oxide layer 161 and a polysilicon gate 163. Preferably, gate oxide layer 161 is formed in the same step as oxide layer 51 (shown in FIG. 5), and polysilicon gate 163 is formed in the same steps as polysilicon gates 53, 54, and 55 (shown in FIG. 5). A source side doped region 165 in epitaxial layer 12 is formed preferably in the same steps as source side channel regions 66 and 67 (shown in FIG. 6). ESD protection device 160 also includes a drain extension region 167, which is preferably formed in the same steps as drain extension region 69 (shown in FIG. 6). A source region 168 and a drain region 169 of ESD protection device 160 are preferably formed in the ion implantation process that forms source and drain regions 86 and 87 (shown in FIG. 6). The ion implantation process also dopes polysilicon gate 163. Source region 168 and drain extension region 167 define a channel region of ESD protection device 160 under polysilicon gate 163. The channel region of ESD protection device 160 has a source side dopant concentration adjacent source region 168 that is higher than a drain side dopant concentration adjacent drain extension region 167. In the ring structure of ESD protection device 160 shown in FIG. 10, drain extension region 167 forms a ring encircling drain region 169. Likewise, source region 168 forms a ring encircling the channel region, drain extension region 167, and drain region 169 of ESD protection device 160.

A nitride spacer 171 and a nitride block 172 are preferably formed in the same steps as nitride spacers 75 and 76 (shown in FIG. 6). A source electrode 174, a drain electrode 175, and a gate electrode 176 of ESD protection device 160 are self aligned titanium silicide structures. Titanium silicide source electrode 174 electrically couples source region 168 to substrate 11 via a ring-shaped sinker 178. Therefore, source region 168 of ESD protection device 160 is grounded. Titanium silicide electrodes 174, 175, and 176 are preferably formed in the same steps as titanium silicide source electrode 96, drain electrode 97, and gate electrode 105 of FET 115 (shown in FIG. 7). Sinker 178 is preferably formed in the same steps as sinker 28 (shown in FIG. 2). Although FIG. 10 shows that nitride block 172 partially overlies polysilicon gate 163, this is not a limitation of the present invention. In an alternative embodiment, nitride block 172 is replaced by a nitride spacer (not shown) that is aligned with gate 163 and overlies drain extension region 167. It should be noted that, like nitride spacers 71, 72, 73, 74, 75, 76, 77, 78, and nitride block 79, nitride spacer 171 and nitride block 172 can be replaced by spacers/blocks made of other types of dielectric materials, e.g., TEOS, undoped polysilicon, or the like. It should also be understood that the source, drain, and gate electrodes of ESD protection device 160 can be formed from other types of conductive silicide structures such as, for example, tungsten silicide, molybdenum silicide, cobalt silicide structures, or the like.

Oxide layer 120 is formed over ESD protection device 160. A metallization region 177 electrically couples titanium silicide gate electrode 176 to titanium silicide source electrode 174. Another metallization region 179 electrically couples titanium silicide drain electrode 175 of ESD protection device 160 to an input/output pad (not shown) on die 10 for transmitting an input/output signal. Thus, ESD protection device 160 protects devices on die 10 from the damage that may be caused by a voltage surge at the input/output pad.

Although FIG. 10 shows ESD protection device 160 as an N-channel ESD protection device with its source coupled to ground, this is not a limitation of the present invention. Die 10 may include other types of ESD protection devices. For example, die 10 may include a P-channel ESD protection device formed in an N-well and having its source region coupled to a supply voltage, e.g., $V_{DD}$. Die 10 may also include an ESD protection device that has field oxide layer 38 as its gate oxide. Further, the doping profile in the channel region of an ESD protection device fabricated on die 10 is not limited to being asymmetric as described herein with reference to ESD protection device 160. An ESD protection device on die 10 can also have a uniform or symmetric doping profile in its channel region. In addition, drain extension region 167 is an optional feature of ESD protection device 160 in accordance with the present invention.

By now it should be appreciated that a semiconductor IC die and a process for fabricating the die have been provided. The IC die is fabricated to include unilateral IGFETs and RF passive devices such as, for example, capacitors, inductors, and resistors and, therefore, can perform RF analog, digital, and mixed mode operations. By properly orienting the unilateral IGFETs, the performance and power efficiency of the circuits such as, RF low noise amplifiers, voltage controlled oscillators, mixers, integrated power amplifiers, etc. in an RF integrated circuit fabricated on the IC die is significantly improved. In accordance with the present invention, the RF passive devices and the unilateral FETs are fabricated on the same die in a fabrication process that is simpler and more cost efficient than the BiCMOS and LDMOS fabrication processes. In addition, the conductive stacks formed by the sinkers and the metallization structures formed thereon provide good isolation between different circuit elements fabricated on the die. Therefore, a single-chip IC, e.g., a monolithic transceiver, can be fabricated using the fabrication process of the present invention to include RF analog circuits such as transceivers, low noise amplifiers, cascode frequency mixers, down converters, integrated power amplifiers, etc. as well as digital circuits such as digital signal processors, microcontrollers, etc. In other words, the fabrication process of the present invention provides a system-on-a-chip. By using a single chip IC system, the chip count in a communication system is significantly reduced compared with the prior art dice fabricated using BiCMOS and LDMOS technologies. The single-chip IC system of the present invention provides a small, light weight, reliable, power efficient, and cost efficient communication product.

We claim:

1. A monolithic radio frequency (RF) mixed signal integrated circuit (IC) with power amplification, comprising:
    a semiconductor substrate of a first conductivity type and having a first dopant concentration;
    an epitaxial layer of the first conductivity type disposed on the semiconductor substrate, the epitaxial layer having a major surface facing away from an interface between the semiconductor substrate and the epitaxial layer and a second dopant concentration lower than the first dopant concentration;
    a first unilateral field effect transistor (FET) having a source region, a channel region, a drain region in a first portion of the epitaxial layer, and a gate structure over the major surface and overlying the channel region, the channel region having a source side dopant concentration near the source region higher than a drain side dopant concentration near the drain region;
    a unilateral power FET having a source region, a channel region, a drain region in a second portion of the epitaxial layer, and a gate structure over the major surface and overlying the channel region, the channel region having a source side dopant concentration near the source region higher than a drain side dopant concentration near the drain region;
    a first sinker of the first conductivity type in the epitaxial layer between the first unilateral FET and the unilateral power FET, extending from the major surface of the epitaxial layer to the interface between the epitaxial layer and the semiconductor substrate, and having a third dopant concentration higher than the second dopant concentration, the first sinker providing signal isolation between the first unilateral FET and the unilateral power FET;
    a field oxide layer disposed on the epitaxial layer;
    a double polysilicon capacitor over a first portion of the field oxide layer, the double polysilicon capacitor including:
        a first polysilicon plate over the first portion of the field oxide layer;
        a dielectric stack on the first polysilicon plate; and
        a second polysilicon plate on the dielectric stack;
    a second sinker extending from the major surface of the epitaxial layer to the interface between the epitaxial layer and the semiconductor substrate and electrically coupled to the first polysilicon plate of the double polysilicon capacitor; and
    a silicide structure formed over the major surface of the epitaxial layer overlying the source region of the unilateral power FET, overlying the first sinker, and electrically coupling the source region of the unilateral power FET to the first sinker.

2. The monolithic RF mixed signal IC of claim 1, wherein the unilateral power FET further includes a drain extension region in the epitaxial layer between the channel region and the drain region of the unilateral power FET.

3. The monolithic RF mixed signal IC of claim 1, further comprising a well of a second conductivity type in the first portion of the epitaxial layer, wherein the source region, the channel region, and the drain region of the first unilateral FET are in the well, the source region and the drain region of the first unilateral FET are of the first conductivity type, and the channel region of the first unilateral FET is of the second conductivity type.

4. The monolithic RF mixed signal IC of claim 3, further comprising a second unilateral FET having a source region of the second conductivity type, a channel region of the first conductivity type, a drain region of the second conductivity type in a third portion of the epitaxial layer, and a gate structure over the major surface and overlying the channel region, the channel region having a source side dopant concentration near the source region higher than a drain side dopant concentration near the drain region.

5. The monolithic RF mixed signal IC of claim 1, wherein the dielectric stack includes:
    a first silicon dioxide layer on the first polysilicon plate;
    a silicon nitride layer on the first silicon dioxide layer; and
    a second silicon dioxide layer on the silicon nitride layer.

6. The monolithic RF mixed signal IC of claim 1, further comprising a polysilicon resistor on a second portion of the field oxide layer.

7. The monolithic RF mixed signal IC of claim 1, further comprising:
    a first insulating layer over the epitaxial layer;
    a metallization structure extending through the first insulating layer and electrically coupled to the first sinker; and
    an inductor over the first insulating layer.

8. The monolithic RF mixed signal IC of claim 7, further comprising a second insulating layer over the first insulating layer, wherein the inductor is on the second insulating layer.

9. The monolithic RF mixed signal IC of claim 1, further comprising an electrostatic discharge (ESD) protection device in a third portion of the epitaxial layer, the ESD protection device having a source region, a channel region, a drain region, a gate structure over the major surface and overlying the channel region, a silicide source electrode formed on the major surface overlying the source region, a silicide drain electrode formed on the major surface overlying the drain region, and a silicide gate electrode formed on the gate structure, wherein the silicide gate electrode is electrically coupled to the silicide source electrode.

10. A monolithic radio frequency (RF) mixed signal integrated circuit (IC) with power amplification, comprising:
a semiconductor substrate of a first conductivity type and having a first dopant concentration;
an epitaxial layer of the first conductivity type disposed on the semiconductor substrate, the epitaxial layer having a major surface facing away from an interface between the semiconductor substrate and the epitaxial layer and a second dopant concentration lower than the first dopant concentration;
a first unilateral field effect transistor (FET) having a source region, a channel region, a drain region in a first portion of the epitaxial layer, and a gate structure over the major surface and overlying the channel region, the channel region having a source side dopant concentration near the source region higher than a drain side dopant concentration near the drain region;
a unilateral power FET having a source region, a channel region, a drain region in a second portion of the epitaxial layer, and a gate structure over the major surface and overlying the channel region, the channel region having a source side dopant concentration near the source region higher than a drain side dopant concentration near the drain region;
a first sinker of the first conductivity type in the epitaxial layer between the first unilateral FET and the unilateral power FET, extending from the major surface of the epitaxial layer to the interface between the epitaxial layer and the semiconductor substrate, and having a third dopant concentration higher than the second dopant concentration, the first sinker providing signal isolation between the first unilateral FET and the unilateral power FET;
an electrostatic discharge (ESD) protection device in a third portion of the epitaxial layer, the ESD protection device having a source region, a channel region, a drain region, a gate structure over the major surface and overlying the channel region, a silicide source electrode formed on the major surface overlying the source region, a silicide drain electrode formed on the major surface overlying the drain region, and a silicide gate electrode formed on the gate structure, wherein the silicide gate electrode is electrically coupled to the silicide source electrode;
a second sinker extending from the major surface of the epitaxial layer to the interface between the epitaxial layer and the semiconductor substrate, and having a fourth dopant concentration higher than the second dopant concentration, wherein the silicide source electrode of the ESD protection device also overlies the second sinker and electrically couples the source region of the ESD protection device to the second sinker; and
a silicide structure formed over the major surface of the epitaxial layer overlying the source region of the unilateral power FET, overlying the first sinker, and electrically coupling the source region of the unilateral power FET to the first sinker.

11. The monolithic RF mixed signal IC of claim 10, wherein:
the ESD protection device further includes a drain extension region between the channel region of the ESD protection device and the drain region of the ESD protection device;
the drain extension region of the ESD protection device forms a first ring encircling the drain region of the ESD protection device;
the channel region of the ESD protection device forms a second ring encircling the first ring;
the source region of the ESD protection device forms a third ring encircling the second ring; and
the second sinker forms a fourth ring encircling the third ring.

12. The monolithic RF mixed signal IC of claim 10, wherein the unilateral power FET further includes a drain extension region in the epitaxial layer between the channel region and the drain region of the unilateral power FET.

13. The monolithic RF mixed signal IC of claim 10, further comprising a well of a second conductivity type in the first portion of the epitaxial layer, wherein the source region, the channel region, and the drain region of the first unilateral FET are in the well, the source region and the drain region of the first unilateral FET are of the first conductivity type, and the channel region of the first unilateral FET is of the second conductivity type.

14. The monolithic RF mixed signal IC of claim 13, further comprising a second unilateral FET having a source region of the second conductivity type, a channel region of the first conductivity type, a drain region of the second conductivity type in a fourth portion of the epitaxial layer, and a gate structure over the major surface and overlying the channel region, the channel region having a source side dopant concentration near the source region higher than a drain side dopant concentration near the drain region.

15. The monolithic RF mixed signal IC of claim 10, further comprising:
a field oxide layer disposed on the epitaxial layer; and
a double polysilicon capacitor over a first portion of the field oxide layer, the double polysilicon capacitor including:
a first polysilicon plate over the first portion of the field oxide layer;
a dielectric stack on the first polysilicon plate; and
a second polysilicon plate on the dielectric stack.

16. The monolithic RF mixed signal IC of claim 15, wherein the dielectric stack includes:
a first silicon dioxide layer on the first polysilicon plate;
a silicon nitride layer on the first silicon dioxide layer; and
a second silicon dioxide layer on the silicon nitride layer.

17. The monolithic RF mixed signal IC of claim 16, further comprising a polysilicon resistor on a second portion of the field oxide layer.

18. The monolithic RF mixed signal IC of claim 10, further comprising:
a first insulating layer over the epitaxial layer;
a metallization structure extending through the first insulating layer and electrically coupled to the first sinker; and
an inductor over the first insulating layer.

19. The monolithic RF mixed signal IC of claim 18, further comprising a second insulating layer over the first insulating layer, wherein the inductor is on the second insulating layer.

* * * * *